(12) United States Patent
Müller et al.

(10) Patent No.: US 12,150,267 B2
(45) Date of Patent: Nov. 19, 2024

(54) BACKPLANE MODULE FOR ELECTRICALLY CONNECTING A PLURALITY OF FUNCTIONAL MODULES, AND MODULAR COMMUNICATIONS SYSTEM

(71) Applicant: Phoenix Contact GmbH & Co. KG, Blomberg (DE)

(72) Inventors: Martin Müller, Lügde (DE); Klas Hellmann, Hameln (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 233 days.

(21) Appl. No.: 17/914,679

(22) PCT Filed: Mar. 18, 2021

(86) PCT No.: PCT/EP2021/057014
§ 371 (c)(1),
(2) Date: Sep. 26, 2022

(87) PCT Pub. No.: WO2021/191055
PCT Pub. Date: Sep. 30, 2021

(65) Prior Publication Data
US 2023/0124987 A1    Apr. 20, 2023

(30) Foreign Application Priority Data
Mar. 27, 2020    (DE) .......................... 102020108610.5

(51) Int. Cl.
*H05K 1/02*    (2006.01)
*G06F 1/26*    (2006.01)
(Continued)

(52) U.S. Cl.
CPC .......... *H05K 7/1484* (2013.01); *H05K 7/1477* (2013.01)

(58) Field of Classification Search
CPC ........ H05K 1/02; H05K 1/144; H05K 1/1484; H05K 3/32; H05K 7/20; H05K 7/1417;
(Continued)

(56) References Cited

U.S. PATENT DOCUMENTS

| 4,658,333 A | 4/1987 | Grimes |
| 5,128,855 A | 7/1992 | Hilber et al. |

(Continued)

FOREIGN PATENT DOCUMENTS

| CN | 1216475 C | 8/2005 |
| CN | 2805235 Y | 8/2006 |

(Continued)

OTHER PUBLICATIONS

Non-Final Rejection Mailed on Mar. 27, 2024 for U.S. Appl. No. 17/768,342, 11 page(s).
(Continued)

*Primary Examiner* — Xiaoliang Chen
(74) *Attorney, Agent, or Firm* — Kaplan Breyer Schwarz, LLP

(57) ABSTRACT

A backplane module for coupling a plurality of function modules, includes a base body, a network coupling element arranged within the base body, at least one first connection device arranged on the base body for coupling a function module, the at least one first connection device having at least one communication interface connected to a port of the network coupling element via a signal line, and at least one second connection device arranged on the base body for coupling a function module, the at least one second connection device having at least two communication interfaces, each of which is connected to one of the ports of the network coupling element via a respective separate signal line, which together can form a logical transmission channel.

11 Claims, 1 Drawing Sheet

(51) Int. Cl.
*G06F 1/30* (2006.01)
*G06F 13/00* (2006.01)
*H04L 12/40* (2006.01)
*H04L 49/101* (2022.01)
*H04L 49/351* (2022.01)
*H04L 49/45* (2022.01)
*H04L 49/506* (2022.01)
*H04L 49/90* (2022.01)
*H04L 49/901* (2022.01)
*H04L 49/9047* (2022.01)
*H04L 67/12* (2022.01)
*H04L 67/5651* (2022.01)
*H04L 69/04* (2022.01)
*H05K 3/32* (2006.01)
*H05K 7/14* (2006.01)
*H05K 7/20* (2006.01)

(58) Field of Classification Search
CPC .. H05K 7/1424; H05K 7/1465; H05K 7/1468; H05K 7/1474; H05K 7/1477; H05K 7/1478; H05K 7/1484; H05K 7/1491; H05K 7/1492; G06F 1/26; G06F 1/30; G06F 13/00; G06F 13/122; G06F 13/387; G06F 13/409; G06F 13/4022; G06F 13/4282; H04L 12/40; H04L 49/45; H04L 49/90; H04L 49/101; H04L 49/351; H04L 49/352; H04L 49/506; H04L 49/901; H04L 49/9047; H04L 67/12; H04L 67/5651; H04L 69/04; H04L 2012/40215
USPC ............... 361/788; 370/392, 403, 434, 501; 709/220
See application file for complete search history.

(56) References Cited

U.S. PATENT DOCUMENTS

| | | | |
|---|---|---|---|
| 5,615,079 | A | 3/1997 | Eggert |
| 5,896,508 | A * | 4/1999 | Lee .................. G06F 13/387 370/434 |
| 6,033,268 | A | 3/2000 | Piper et al. |
| 6,241,561 | B1 | 6/2001 | Zebermann et al. |
| 6,640,308 | B1 | 10/2003 | Keyghobad et al. |
| 6,690,668 | B1 * | 2/2004 | Szczepanek ........ H04L 49/9047 370/403 |
| 6,728,239 | B1 | 4/2004 | Kung et al. |
| 6,947,410 | B1 | 9/2005 | Schwartz et al. |
| 7,286,552 | B1 | 10/2007 | Gupta et al. |
| 7,359,371 | B2 | 4/2008 | Emley et al. |
| 7,408,876 | B1 | 8/2008 | Gupta et al. |
| 7,599,292 | B1 | 10/2009 | Gupta et al. |
| 7,719,992 | B1 | 5/2010 | Gourlay et al. |
| 8,204,070 | B1 | 6/2012 | Ghaibeh |
| 8,654,680 | B2 | 2/2014 | Subramanian et al. |
| 8,711,681 | B2 | 4/2014 | Hu et al. |
| 8,758,061 | B2 | 6/2014 | Mische et al. |
| 8,799,551 | B2 | 8/2014 | Ham |
| 8,867,552 | B2 | 10/2014 | Vobbilisetty et al. |
| 8,958,414 | B1 | 2/2015 | Wong |
| 9,225,556 | B2 | 12/2015 | Chini et al. |
| 10,186,821 | B2 | 1/2019 | Müller et al. |
| 10,313,103 | B1 | 6/2019 | Perras et al. |
| 2002/0065935 | A1 | 5/2002 | Koperda et al. |
| 2003/0021080 | A1 | 1/2003 | Koperda et al. |
| 2003/0174719 | A1 | 9/2003 | Sampath et al. |
| 2004/0033720 | A1 | 2/2004 | Bergner et al. |
| 2004/0085894 | A1 | 5/2004 | Wang et al. |
| 2004/0105425 | A1 | 6/2004 | Chen et al. |
| 2004/0131073 | A1 | 7/2004 | Hahn et al. |
| 2004/0158667 | A1 | 8/2004 | Carr |
| 2004/0240180 | A1 | 12/2004 | Crippen et al. |
| 2005/0044137 | A1 | 2/2005 | Dubreuil |
| 2005/0078706 | A1 | 4/2005 | Spencer |
| 2005/0135387 | A1 | 6/2005 | Rychener et al. |
| 2005/0228889 | A1 | 10/2005 | Cohen et al. |
| 2007/0060362 | A1 | 3/2007 | Osgood et al. |
| 2008/0123635 | A1 | 5/2008 | Mortensen et al. |
| 2008/0205418 | A1 | 8/2008 | Rose et al. |
| 2011/0243152 | A1 | 10/2011 | Goncalves et al. |
| 2011/0292206 | A1 | 12/2011 | Newton |
| 2012/0026648 | A1 | 2/2012 | Schneider et al. |
| 2012/0290759 | A1 | 11/2012 | Blair et al. |
| 2012/0294156 | A1 | 11/2012 | Hack et al. |
| 2013/0045613 | A1 | 2/2013 | Griese et al. |
| 2013/0100884 | A1 | 4/2013 | King et al. |
| 2013/0301495 | A1 | 11/2013 | Miller |
| 2015/0023368 | A1 | 1/2015 | Connolly et al. |
| 2015/0043576 | A1 | 2/2015 | Dixon et al. |
| 2015/0120001 | A1 | 4/2015 | German et al. |
| 2015/0121507 | A1 | 4/2015 | Haija et al. |
| 2015/0188798 | A1 | 7/2015 | Mizrahi et al. |
| 2015/0263762 | A1 | 9/2015 | Shen et al. |
| 2015/0333637 | A1 | 11/2015 | Izumi |
| 2016/0037240 | A1 | 2/2016 | Yang et al. |
| 2016/0173021 | A1 | 6/2016 | Lelkes |
| 2016/0173371 | A1 | 6/2016 | Bays |
| 2016/0191418 | A1 | 6/2016 | Kong |
| 2017/0070365 | A1 | 3/2017 | Varmani |
| 2017/0244635 | A1 | 8/2017 | Felemban et al. |
| 2018/0069359 | A1 | 3/2018 | Müller et al. |
| 2018/0139062 | A1 | 5/2018 | Alley et al. |
| 2018/0281598 | A1 | 10/2018 | Shu |
| 2019/0238349 | A1 | 8/2019 | Moffitt et al. |
| 2019/0319394 | A1 | 10/2019 | Trenkamp et al. |
| 2020/0078070 | A1 | 3/2020 | Henderson et al. |
| 2020/0127869 | A1 | 4/2020 | Spanjers |
| 2020/0153174 | A1 | 5/2020 | Curtis et al. |
| 2020/0195450 | A1 | 6/2020 | Bains et al. |
| 2020/0221544 | A1 | 7/2020 | Nishizaki et al. |
| 2020/0235780 | A1 | 7/2020 | Bains et al. |
| 2020/0394146 | A1 | 12/2020 | McLaughlin et al. |
| 2020/0408565 | A1 | 12/2020 | Lee et al. |
| 2021/0144877 | A1 | 5/2021 | Lessmann |
| 2021/0235594 | A1 * | 7/2021 | Teeter .................. H05K 7/1491 |
| 2022/0046114 | A1 * | 2/2022 | Entelis .................. H04L 12/40 |
| 2022/0209987 | A1 | 6/2022 | Müller |

FOREIGN PATENT DOCUMENTS

| | | |
|---|---|---|
| CN | 102099783 A | 6/2011 |
| CN | 102833112 A | 12/2012 |
| CN | 103164380 A | 6/2013 |
| CN | 104243297 A | 12/2014 |
| CN | 204578558 U | 8/2015 |
| CN | 204721371 U | 10/2015 |
| CN | 105099820 A | 11/2015 |
| CN | 105453492 | 3/2016 |
| CN | 105703690 A | 6/2016 |
| CN | 206364825 U | 7/2017 |
| CN | 207601619 U | 7/2018 |
| CN | 207926649 U | 9/2018 |
| DE | 3688778 T2 | 3/1994 |
| DE | 4421267 A1 | 1/1996 |
| DE | 4438804 C1 | 3/1996 |
| DE | 19600644 C1 | 4/1997 |
| DE | 19651961 A1 | 6/1998 |
| DE | 19706636 A1 | 8/1998 |
| DE | 29706564 U1 | 8/1998 |
| DE | 29901194 U1 | 5/1999 |
| DE | 19807710 A1 | 9/1999 |
| DE | 19902745 A1 | 8/2000 |
| DE | 20015758 U1 | 1/2002 |
| DE | 10148470 A1 | 4/2003 |
| DE | 10204694 A1 | 7/2003 |
| DE | 10216115 A1 | 10/2003 |
| DE | 10316649 A1 | 11/2003 |
| DE | 20217772 U1 | 3/2004 |
| DE | 10245643 A1 | 4/2004 |
| DE | 10254285 A1 | 6/2004 |
| DE | 10360190 A1 | 7/2004 |
| DE | 102004056363 A1 | 6/2006 |

(56) References Cited

FOREIGN PATENT DOCUMENTS

| | | |
|---|---|---|
| DE | 102005010820 A1 | 9/2006 |
| DE | 60123984 T2 | 6/2007 |
| DE | 102007009552 A1 | 8/2008 |
| DE | 60133747 T2 | 7/2009 |
| DE | 102009001177 A1 | 9/2010 |
| DE | 102009003846 A1 | 11/2010 |
| DE | 202011000834 U1 | 11/2011 |
| DE | 202011000835 U1 | 11/2011 |
| DE | 202011105337 U1 | 11/2011 |
| DE | 102011051154 A1 | 2/2012 |
| DE | 102011006590 A1 | 5/2012 |
| DE | 102013003971 A1 | 9/2014 |
| DE | 102013206723 A1 | 10/2014 |
| DE | 102015200568 A1 | 7/2015 |
| DE | 102014004241 A1 | 10/2015 |
| DE | 102014110017 A1 | 1/2016 |
| DE | 102014111030 A1 | 2/2016 |
| DE | 102014115678 A1 | 4/2016 |
| DE | 102015223315 A1 | 5/2016 |
| DE | 102014119065 A1 | 6/2016 |
| DE | 102014119101 A1 | 6/2016 |
| DE | 102016110641 B3 | 11/2017 |
| DE | 102016215742 A1 | 3/2018 |
| DE | 102016223024 A1 | 5/2018 |
| DE | 102016124637 A1 | 6/2018 |
| DE | 102017212256 A1 | 1/2019 |
| DE | 102017212487 A1 | 1/2019 |
| EP | 0345493 A1 | 12/1989 |
| EP | 0364618 A1 | 4/1990 |
| EP | 0710064 A1 | 5/1996 |
| EP | 0776077 A2 | 5/1997 |
| EP | 1126665 A2 | 8/2001 |
| EP | 1203303 A1 | 5/2002 |
| EP | 1282287 A2 | 2/2003 |
| EP | 1547314 A1 | 6/2005 |
| EP | 1576765 A1 | 9/2005 |
| EP | 1800450 A1 | 6/2007 |
| EP | 1884148 A2 | 2/2008 |
| EP | 1983812 A1 | 10/2008 |
| EP | 2002348 A2 | 12/2008 |
| EP | 2161638 A1 | 3/2010 |
| EP | 2187571 A1 | 5/2010 |
| EP | 2211523 A1 | 7/2010 |
| EP | 2241980 A1 | 10/2010 |
| EP | 2282321 A1 | 2/2011 |
| EP | 2405612 A1 | 1/2012 |
| EP | 2421100 A1 | 2/2012 |
| EP | 2448182 A1 | 5/2012 |
| EP | 2456133 A1 | 5/2012 |
| EP | 2631810 A1 | 8/2013 |
| EP | 2648284 A1 | 10/2013 |
| EP | 2698677 A1 | 2/2014 |
| EP | 2765465 A1 | 8/2014 |
| EP | 2913727 A1 | 9/2015 |
| EP | 3032732 A2 | 6/2016 |
| EP | 3040794 A1 | 7/2016 |
| EP | 3090511 A1 | 11/2016 |
| EP | 3179689 A1 | 6/2017 |
| EP | 3192704 A1 | 7/2017 |
| EP | 3256983 A1 | 12/2017 |
| EP | 3324579 A1 | 5/2018 |
| EP | 3373527 A1 | 9/2018 |
| GB | 2404815 A | 2/2005 |
| JP | 03-016383 U | 2/1991 |
| JP | 2004-227570 | 8/2004 |
| JP | 2006-314098 | 11/2006 |
| JP | 2008-078906 | 4/2008 |
| JP | 2008-547294 | 12/2008 |
| JP | 2009-211838 A | 9/2009 |
| JP | 2011-049659 A | 3/2011 |
| JP | 2011-185612 A | 9/2011 |
| JP | 5040246 B2 | 10/2012 |
| JP | 2015-530046 | 10/2015 |
| JP | 2016-081391 | 5/2016 |
| JP | 2018-073418 | 5/2018 |
| JP | 2018-514904 | 6/2018 |
| KR | 10-0404092 B1 | 11/2003 |
| WO | 94/27196 A1 | 11/1994 |
| WO | 97/41650 A1 | 11/1997 |
| WO | 99/23737 A1 | 5/1999 |
| WO | 00/64099 A2 | 10/2000 |
| WO | 01/09739 A1 | 2/2001 |
| WO | 02/27465 A1 | 4/2002 |
| WO | 2003/107594 A1 | 12/2003 |
| WO | 2004/054174 A1 | 6/2004 |
| WO | 2006/039941 A1 | 4/2006 |
| WO | 2006/124515 A2 | 11/2006 |
| WO | 2007/121022 A2 | 10/2007 |
| WO | 2008/097992 A1 | 8/2008 |
| WO | 2012/000807 A1 | 1/2012 |
| WO | 2012/000808 A1 | 1/2012 |
| WO | 2015/103469 A1 | 7/2015 |
| WO | 2015/198087 A1 | 12/2015 |
| WO | 2016/094825 A1 | 6/2016 |
| WO | 2016/128668 A1 | 8/2016 |
| WO | 2016/151019 A1 | 9/2016 |
| WO | 2017/037381 A1 | 3/2017 |
| WO | 2018/049314 A1 | 3/2018 |
| WO | 2018/068040 A1 | 4/2018 |
| WO | 2018/104929 A1 | 6/2018 |
| WO | 2019/043446 A1 | 3/2019 |

OTHER PUBLICATIONS

Office Action issued in Japanese Patent Application No. 2022-554821 on Apr. 10, 2024 and English Translation thereof.
Office Action issued in Japanese Patent Application No. 2021-560962 on Apr. 12, 2023 and English Translation thereof.
Authorized Officer: Martinez Orta, Maxima, "International Search Report and Written Opinion" issued in counterpart PCT application No. PCT/EP2016/056385, dated Jul. 5, 2016.
Matthias Mueller, "Office Action" issued in counterpart German patent application No. 102015104290.8, dated Jan. 18, 2016.
Notice of Allowance and Fees Due (PTOL-85) received for U.S. Appl. No. 15/560,016, mailed on Nov. 15, 2018, 2 pages.
Notice of Allowance received for U.S. Appl. No. 15/560,016, mailed on Oct. 1, 2018, 2 pages.
Notice of Allowance received for U.S. Appl. No. 15/560,016, mailed on Sep. 12, 2018, 5 pages.
Office Action issued on Nov. 22, 2023 in Japanese Patent Application No. 2022-554821 and English Translation thereof.
Office Action issued in Japanese patent application No. 2017-549774, Sep. 28, 2018, 9 pp.
Office Action issued in Chinese patent application No. 202080072299.5, Apr. 29, 2023, 18 pp. w/ translation.
"Ethernet over twisted pair", Wikipedia, the free encyclopaedia, 4 pp., https://en.wikipedia.org/wiki/OI-Link, Feb. 13, 2019.
"IO-Link", Wikipedia, the free encyclopaedia, 7 pp. w/ translation, https://en.wikipedia.org/wiki/OI-Link, Feb. 13, 2019.
ABB Research Ltd, English Translation of Indian patent application No. 932/CHE/2008 filed on Apr. 16, 2008 entitled "An Intelligent Electronic Device for Substation or Distribution Automation Systems" (published application was not available), Jul. 2, 2010, 7 pp.
Authorized Officer: Bielert, Erwin, International Search Report issued in PCT application No. PCT/EP2021/057014, Jun. 17, 2021, 3 pp.
Authorized Officer: Mircescu, Alexander, International Search Report issued in PCT application No. PCT/EP2020/061230, Jul. 2, 2020, 3 pp.
Authorized Officer: Nora Lindner, English Translation of the International Preliminary Report on Patentability issued in PCT application No. PCT/EP2020/078742, Apr. 19, 2022, 10 pp.
Authorized Officer: Nora Lindner, English translation of the International Preliminary Report on Patentability issued in PCT application No. PCT/EP2020/061230, Sep. 28, 2021, 7 pp.
Authorized Officer: Weinmiller, Jost, International Search Report issued in PCT application No. PCT/EP2020/078742, Jan. 13, 2021, 2 pp.

(56) References Cited

OTHER PUBLICATIONS

English Translation of International Preliminary Report on Patentability issued on Sep. 22, 2022 in PCT Patent Application No. PCT/EP2021/057014.
Office Action issued in German patent application No. 102019110592.7, Feb. 13, 2020, 15 pp. w/ translation.
Office Action issued in German patent application No. 102019127551.2, Aug. 25, 2020, 17 pp. w/ translation.
Office Action issued in German patent application No. 102019127195.9, Jun. 3, 2020, 26 pp.
Office Action issued in Chinese patent application No. 202011072393.9, Dec. 2, 2021, 21 pp. w/ translation.
Office Action issued in Chinese patent application No. 202011072393.9, Jun. 29, 2022, 19 pp. w/ translation.
Office Action issued in Chinese patent application No. 2020800306862, Aug. 26, 2022, 14 pp. w/ translation.
Search Report issued in Belgian patent application No. BE2019/5271, Oct. 16, 2019, 10 pp.
Inventor: Martin Müller, Multifunctional Network Switch for Use in a Process-Controlling Automation System . . . , Apr. 12, 2022, Unpublished Related U.S. Appl. No. 17/768,342.
Non-Final Office Action Mailed on Dec. 8, 2022 for U.S. Appl. No. 17/605,401.
Office Action issued Nov. 30, 2022 in Japanese Patent Application No. 2021-560962 and English Translation thereof.
Wikipedia, "Ethernet over twisted pair", Mar. 25, 2019, 4 pp.
Wikipedia, IO-Link definition, Feb. 5, 2019, 7 pp., https://de.wikipedia.org/w/index.php?title=IO-Link&oldid=185391430 English Translation: https://en.wikipedia.org/wiki/IO-Link.
Non-Final Rejection Mailed on Jul. 3, 2023 for U.S. Appl. No. 17/605,401, 10 page(s).
Non-Final Rejection Mailed on May 21, 2024 for U.S. Appl. No. 17/605,401, 11 page(s).
Notice of Allowance and Fees Due (PTOL-85) Mailed on May 13, 2024 for U.S. Appl. No. 17/066,388, 8 page(s).
Final Rejection Mailed on Jan. 12, 2024 for U.S. Appl. No. 17/605,401, 13 page(s).
Notice of Allowance and Fees Due (PTOL-85) Mailed on Feb. 7, 2024 for U.S. Appl. No. 17/066,388, 8 page(s).
Non-Final Rejection Mailed on Aug. 23, 2023 for U.S. Appl. No. 17/066,388, 6 page(s).
Office Action issued in Japanese Patent Application No. 2022-521077 on Nov. 22, 2023 and English Translation thereof.

* cited by examiner

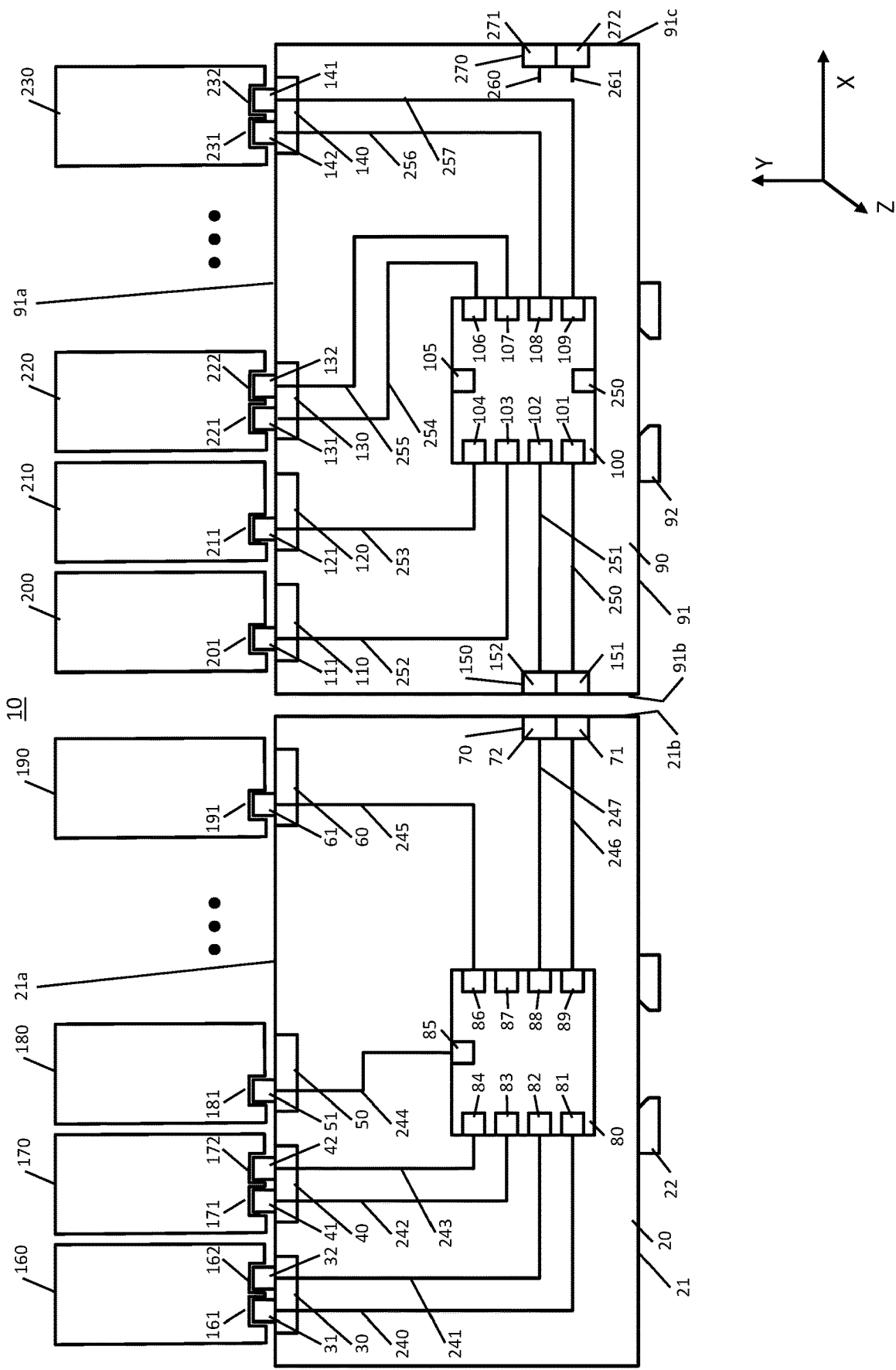

BACKPLANE MODULE FOR ELECTRICALLY CONNECTING A PLURALITY OF FUNCTIONAL MODULES, AND MODULAR COMMUNICATIONS SYSTEM

FIELD

The invention relates to a backplane module for coupling a plurality of function modules and to a modular communication system comprising at least one such backplane module.

BACKGROUND

Backplane systems, also known as rear panel systems, are found in modular devices, for example. A backplane system can, for example, have a backplane bus and several slots that are electrically connected via the backplane bus. Various electronic modules can be plugged into the slots.

It is also known that device modules that can be arranged side by side can be electrically connected to each other via a backplane or rear panel, with a point-to-point connection existing between each two adjacent modules. In this case, each device module forwards data to a module that is arranged behind the forwarding device module in the direction of transmission. However, there is the problem that if one of the modules fails, all modules located behind the defective module in the direction of transmission are also cut off from communication. It is also not possible to remove or replace modules during operation without loss of communication to other modules.

A packet-switched rear panel or backplane is known from GB 2 404 815 B, which has several slots that are electrically connected via the backplane. Herein, the known backplane is designed as a passive component, electrically connecting the slots via point-to-point connections, i.e.

in a fixed predetermined manner. An aggregation card containing an Ethernet switch can be plugged into one of the slots.

US 2005/0078706 A1 also discloses a packet-switched backplane that can interconnect switching nodes and payload nodes via individual point-to-point links or via a bus.

SUMMARY

The object of the invention is to provide a backplane module for coupling a plurality of function modules, the backplane module enabling flexible electrical connection of its connection devices and dynamically variable communication between function modules connected to the connection devices. A further object can be seen in providing a modular communication system, in particular for industrial process control, which has at least one such backplane module.

A core idea of the invention can be seen in equipping a backplane module, also called a rear panel module, with an active component, via which slots can be flexibly and in a dynamically changeable way interconnected as required. The active component is a network coupling element, which can also be referred to as a network switch.

The above-mentioned technical problem is solved by the features of claim 1 and also by the features of claim 7, which relates to a modular communication system, in particular for industrial process control.

Advantageous further developments and embodiments are the subject of the dependent claims.

BRIEF DESCRIPTION OF THE DRAWING

Further advantages and features of the invention are apparent from the following description of an exemplary embodiment with reference to the accompanying drawing, in which:

FIG. 1 is a schematic view of an exemplary embodiment of a modular communication system according to the present invention, for use in an automation system for industrial process control.

DETAILED DESCRIPTION

FIG. 1 shows an exemplary modular communication system 10, which can be used in particular in an automation system for industrial process control. The exemplarily shown modular communication system 10 has at least one backplane module 20 for electrical, optical, capacitive or inductive coupling and preferably also for mechanical coupling of a plurality of function modules 160-190. The function modules 160-190 are preferably modules in which at least one electronic circuit is implemented in each case. For example, a function module may be implemented as an input/output module, also known as an I/O module, as a controller, for example as a programmable logic controller (PLC), with which, for example, an industrial process can be controlled. Input/output modules may be sensors and actuators. In this case, the exemplary modular communication system 10 serves in particular to transmit process data between the function modules via the backplane module 20 and, if present, via at least one further backplane module 90.

The backplane module 20 has a base body 21, which can be designed as a housing, for example. A network coupling element 80 is arranged within the base body 21, which has a plurality of ports 81-89. The network coupling element 80 can be, for example, an Ethernet switch that can specifically switch data packets between its ports 81-89 according to an Ethernet protocol. At least one connection device 50 is arranged on the base body 21, which is designed for electrically and preferably also mechanically coupling a function module, for example the function module 180. The connection device 50 can be designed as an Ethernet connector. The connection device 50 has at least one communication interface 51 which is connected to a port, for example the port 85 of the network element 80 via a signal line 244. The function module 180 has, for example, a connection device with a communication interface 181 to be coupled to the connection device 50. A second connection device 30 is preferably arranged on the base body 21, which is designed for electrically and preferably also mechanically coupling a function module, for example the function module 160. The second connection device 30 has at least two communication interfaces 31 and 32, each of which is connected to a port of the network coupling element 80 via separate signal lines which can form a logical transmission channel. As shown, the communication interface 31 is connected to the port 81 via a signal line 240, while the communication interface 32 is connected to the port 82 of the network coupling element 80 via a signal line 241. It should already be mentioned at this point that, with the cooperation of the network coupling element 80, a so-called link aggregation function can be carried out with respect to the connection device 30, in which several physical interfaces, for example the communication interfaces 31 and 32, can be logically bundled into one channel, for example in order to increase the data throughput and the fail-safety compared to a single communication interface. For example, the link aggregation control protocol (LACP) can be used for this purpose. In other words, the network coupling element 80 may be configured to execute the LACP protocol to, for example, receive or transmit data to and from the function module 160 over a logical transmission channel that bundles the two signal lines 240 and 241.

For example, to be electrically connected to the connection device 30, the function module 160 comprises a connection device that includes two communication interfaces 161 and 162. Alternatively, the connection device 30 can be optically, capacitively or inductively coupled to the communication interfaces 161 and 162. The function module 160 is preferably configured to send data to the network coupling element 80 and receive data from the network coupling element 80 via a logical transmission channel comprising the two separate signal lines 240 and 241.

A further connection device 40 may be arranged on the base body 21, which may comprise at least two communication interfaces 41 and 42, each of which is connected to a port of the network coupling element 80 via separate signal lines. As shown, the communication interface 41 is connected to the port 83 via a signal line 242, while the communication interface 42 is connected to the port 84 of the network coupling element 80 via a signal line 243. The two signal lines 242 and 243 may in turn form a logical transmission channel, depending on the configuration. In order to be able to be connected to the connection device 40, the function module 170 has a connection device, which includes two communication interfaces 171 and 172. For this purpose, the connection device 4 can be optically, inductively, capacitively or electrically coupled to the communication interfaces 171 and 172. The function module 170 is preferably designed to send data to the network coupling element 80 and to receive data from the network coupling element 80 via a logical transmission channel comprising the two separate signal lines 242 and 243.

FIG. 1 shows a fourth connection device 60 arranged on the base body 21, which can have at least one communication interface 61 that is electrically connected to the port 86 via a signal line 245. The function module 190 has a connection device with a communication interface 191, which can be electrically, optically, inductively or capacitively, and preferably also mechanically, coupled to the connection device 60 of the backplane module 20. It should be noted that, as indicated in FIG. 1, the backplane module 20 can also have more than the four connection devices 30 to 60.

In order to be able to flexibly expand the modular communication system 10, a further connection device 70 can be provided on the base body 21, which has at least one communication interface. In the example shown, the connection device 70 has two communication interfaces 71 and 72. The connection device 70 is designed for electrical connection and in particular also for mechanical coupling of the backplane module 20 to a further backplane module 90.

As shown in FIG. 1, the connection devices 30, 40, 50 and 60 are arranged next to one another and at a distance from one another on a base surface 21a, which lies in the xz plane, with respect to an imaginary line running parallel to the x axis of the coordinate system shown in FIG. 1. The connection device 70 is arranged on an end face 21b of the base body 21 extending perpendicularly to the base face 21a, the end face 21b lying in the yz plane of the coordinate system shown in FIG. 1. It should be noted at this point that the base surface 21a may have a depth in the −z-direction corresponding, for example, to the depth or length of the function modules 160-190. The backplane module 20 may further comprise latching elements 22 to be latched onto a mounting rail.

In order to be able to be electrically and mechanically coupled to the backplane module 20, the backplane module 90 has a connection device 150 which is arranged on a base body 91 and preferably has two communication interfaces 151 and 152, the connection device 150 being designed to be complementary to the connection device 70 of the backplane module 20. The connection device 150 is arranged on an end face 91b of the base body 91 lying in the yz plane. As can be seen in FIG. 1, the connection devices 70 and 150 are aligned in the assembled state. Complementary latching elements can be provided on the end faces 21b and 91b for mechanically coupling the backplane modules 20 and 90.

Similar to the backplane module 20, a network coupling element 100 with a plurality of ports 101 to 109 is arranged in the base body 91 of the backplane module 90, which in turn can preferably be designed as an Ethernet switch. Furthermore, the backplane module 90 has, for example, a connection device 110 with a communication interface 111, a further connection device 120 with a communication interface 121, a further connection device 130 with two communication interfaces 131 and 132, and a further connection device 140 with two communication interfaces 141 and 142. Similar to the backplane module 20, the connection devices 110 to 140 are arranged on a base surface 91a of the base body 91 lying in the xz plane. One function module can be respectively connected to each of the connection devices 110 to 140. However, the backplane module 90 may also have more than the four connection devices 110 to 140. As shown in FIG. 1, a function module 200 comprising a communication interface 201 can be electrically, optically, capacitively or inductively, and preferably also mechanically, coupled to the connection device 110. A function module 210, which has a communication interface 211, can be electrically, optically, capacitively or inductively and preferably also mechanically coupled to the connection device 120 of the backplane module 90. A further function module 220, which has two communication interfaces 221 and 222, can be electrically, optically, capacitively or inductively and preferably also mechanically coupled to the connection device 130, which also has two communication interfaces 131 and 132. A further communication module 230 having two communication interfaces 231 and 232 can be electrically, optically, capacitively or inductively and preferably also mechanically coupled to the connection device 140. As can be seen in FIG. 1, the communication interface 111 is connected to a port 103 of the network coupling element 100 via a signal line 252. The communication interface 151 is connected to the port 101 via a signal line 250, the communication interface 152 is connected to the port 102 via a signal line 251, the communication interface 121 is connected to the port 104, the two communication interfaces 131 and 132 of the connection device 130 are connected to the port 106 via a signal line 254 and to the port 107 via a signal line 255, respectively, while the two communication interfaces 141 and 142 of the connection device 140 are connected to the port 109 via a signal line 257 and to the port 108 of the network communication element 100 via a signal line 256.

It should be noted that the two network coupling elements 80 and 100 can be connected to each other in accordance with the stacking method known from network technology in such a way that they and thus the two backplane modules 20 and 90 appear to the outside as one system unit with only one IP address. For this purpose, for example, a connection comprising the signal lines 247 and 251 or the signal lines 246 and 250 or a separate connection (not shown) can be used.

At an end face 91c opposite the end face 91b, a further connection device 270 may be provided on the base body 91 of the backplane module 90, which has, for example, two communication interfaces 271 and 272 that are connected via a signal line 261, for example, to the port 250 and via a signal line 260 to the port 105 of the network coupling element 100. The connection device of another backplane module (not shown) can be connected to the connection device 270. Also, the base body 91 of the backplane module 90 may comprise latching elements 92 for latching onto a support rail that would be parallel to the x-axis in the illustrated embodiment.

The two network coupling elements 80 and 100 can each be designed as a VLAN-capable network coupling element. In this way, it is possible within the network coupling element 80 or the network coupling element 100 or even via the two network coupling elements 80 and 100 to establish a virtual connection or a logical subnetwork between individual connection devices and thus between some of the function modules 160 to 230, for example between the function modules 160 and 230. For example, a virtual connection can be established in this way between the connection device 30 and the connection device 140 via the signal lines 240, 246, 250 and 257. In this way, functions such as the synchronization of redundant function modules, for example of the function modules 160 and 230, can be realized without having to implement separate communication technologies intended exclusively for this function.

Thanks to the use of backplane modules, each of which has active network coupling elements, a complex, modular communication system 10 can be implemented in a simple and flexible manner, which can in particular be designed for industrial process control.

At least some of the aspects explained above by way of example are summarized again below.

A backplane module for coupling a plurality of function modules is provided, wherein the backplane module 20 or the backplane module 90 shown in FIG. 1 is used as an example. Function modules 160 to 190, for example, can be connected to the backplane module 20, and function modules 200 to 230, for example, can be connected to the backplane module 90. The backplane module 20 or 90 may have the following features:

a base body 21; 91, a network coupling element 80; 100 arranged within the base body 21; 91 and having a plurality of ports 81-89; 101-109, at least one first connection device 50; 110 arranged on the base body 21; 91 and designed for coupling a function module 180; 200, wherein the at least one first connection device 50; 110 has at least one communication interface 51; 111 which is connected to a port 85; 103 of the network coupling element 80; 100 via a signal line 244; 252, at least one second connection device 30; 130 which is arranged on the base body 21; 91 and is designed for coupling a function module 160; 220, wherein the at least one second connection device 30; 130 has at least two communication interfaces 31, 32; 131, 132, each of which is connected to one of the ports 81, 82; 106, 107 of the network coupling element 80; 100 via a separate signal line 240, 241; 254, 255, respectively, which together can form a logical transmission channel, wherein the network coupling element 80; 100 is designed for receiving and transmitting data packets from and to the at least one first connection device 50; 110 and the at least one second connection device 30; 130.

Preferably, at least one third connection device 70; 270 with at least one communication interface 71, 72; 271, 272 is arranged on the base body 21; 91, which is designed to couple the backplane module 20; 90 to a further backplane module.

A compact and space-saving arrangement results, for example, from the fact that the at least one first connection device 50; 110 and the at least one second connection device 30; 130 are arranged next to one another and at a distance from one another with respect to an imaginary line on a base surface 21a; 91a of the base body 21; 91, and that the at least one third connection device 70; 150 is arranged on a surface 21b; 91b of the base body 21; 91 running perpendicular to the base surface 21a; 91a.

Expediently, the network coupling element 80; 100 may be designed as an Ethernet switch.

The performance of the backplane module 20; 90 may be increased by the network coupling element 80; 100 optionally or additionally being a VLAN-capable network coupling element.

In order to be able to install the backplane module 20; 90 in a control cabinet, for example, mounting elements 22; 92 can be formed on the base body 21; 91 for mounting the backplane module 20; 90 on a mounting rail.

According to a further aspect, a modular communication system 10 is provided, which may be designed in particular for industrial process control, which may have the following features:

a first backplane module 20, as explained above, at least one first function module 180, which has a connection device with at least one communication interface 181, the at least one first function module 180 being optically, capacitively, electrically or inductively and preferably also mechanically coupled to the first backplane module 20 via the at least one first connection device 50, at least one second function module 160, which has a connection device with at least two communication interfaces 161, 162 and which is optically, capacitively, electrically or inductively and preferably also mechanically coupled to the first backplane module 20 via the second connection device 30.

In an advantageous further embodiment, a second backplane module 90 coupled to the first backplane module 20 is provided, as described above, wherein the network coupling element 80 of the first backplane module 20 and the network coupling element 100 of the second backplane module 90 are interconnected via at least one electrical connection (246, 250; 247, 251). An electrical connection may comprise signal lines 246 and 250. An alternative or additional connection may comprise signal lines 247 and 251. At least one third function module 200 is provided, which comprises a connection device with at least one communication interface 201, wherein the at least one third function module 200 is optically, capacitively, electrically or inductively and preferably also mechanically coupled to the second backplane module 90 via the at least one first connection device 110. Furthermore, at least one fourth function module 220 is provided, which has a connection device with at least two communication interfaces 221, 222 and which is optically, capacitively, electrically or inductively and preferably also mechanically coupled to the second backplane module 90 via the at least one second connection device 130.

For example, in order to be able to increase the data throughput between at least two function modules, the function modules, for example the function modules 160 and 170 may be interconnected by means of the network coupling element 80 via at least two separate electrical connections that may form a logical transmission channel. In the exemplary case, for example, one electrical connection comprises signal lines 240 and 242, while the other connection may comprise signal lines 241 and 243.

Preferably, at least two of the function modules, for example, the function modules 160 and 230 may communicate via a virtual connection. In this case, a virtual connection can be established via the communication interface 31, the signal line 240, the ports 81 and 89 of the network coupling element 80, the signal lines 246 and 250, the ports 101 and 109 of the network coupling element 100, the signal line 257 and the communication interface 232.

Preferably, each of the function modules 160-230 may be an I/O module, a communication module, or a controller.

It should also be noted that in the simplest case, the communication interfaces can be electrical connections. However, they can also be designed as inductive, optical or capacitive coupling elements.

The invention claimed is:

1. A backplane module for coupling a plurality of function modules, comprising:
    a base body,
    a network coupling element arranged within the base body and having a plurality of ports,
    at least one first connection device arranged on the base body, which is designed for coupling a function module, wherein the at least one first connection device has at least one communication interface which is connected to a port of the network coupling element via a signal line,
    at least one second connection device arranged on the base body, which is designed for coupling a function module, wherein the at least one second connection device has at least two communication interfaces, each of which is connected to one of the ports of the network coupling element via a separate signal line in each case, which together can form a logical transmission channel, the network coupling element being designed to receive and transmit data packets from and to the at least one first connection device and the at least one second connection device.

2. The backplane module according to claim 1, further comprising at least one third connection device with at least one communication interface arranged on the base body, which is designed for coupling the backplane module to a further backplane module.

3. The backplane module according to claim 2, wherein the at least one first connection device and the at least one second connection device are arranged next to one another and at a distance from one another with respect to an imaginary line on a base surface of the base body, and the at least one third connection device is arranged on a surface of the base body running perpendicularly to the base surface.

4. The backplane module according to claim 1, wherein the network coupling element is an Ethernet switch.

5. The backplane module according to claim 1, wherein the network coupling element is a VLAN-capable network coupling element.

6. The backplane module according to claim 1, further comprising mounting elements for mounting the backplane module on a mounting rail, the mounting elements formed on the base body.

7. A modular communication system for industrial process control, comprising:
    a first backplane module according to claim 1,
    at least one first function module, which has a connection device with at least one communication interface, the at least one first function module coupled to the first backplane module via the at least one first connection device, and
    at least one second function module, which has a connection device with at least two communication interfaces and which is coupled to the first backplane module via the second connection device.

8. The modular communication system according to claim 7, further comprising:
    a second backplane module coupled to the first backplane module, wherein the network coupling element of the first backplane module and a network coupling element of the second backplane module are interconnected via at least one electrical connection,
    at least one third function module which has a connection device with at least one communication interface, the at least one third function module coupled to the second backplane module via the at least one first connection device,
    at least one fourth function module which has a connection device with at least two communication interfaces and which is coupled to the second backplane module via the at least one second connection device.

9. The modular communication system according to claim 8, further comprising:
    at least two of the function modules interconnected via at least two links that form a logical transmission channel.

10. The modular communication system according to claim 8, further comprising:
    at least two of the function modules communicating via a virtual connection.

11. The modular communication system according to claim 7, wherein each of the function modules is designed as an I/O module, as a communication module or as a controller.

* * * * *